United States Patent
Yao et al.

(10) Patent No.: US 12,386,387 B2
(45) Date of Patent: Aug. 12, 2025

(54) SYSTEMS AND METHODS FOR OVERMOLDING ON ELECTRONIC DEVICE SURFACES

(71) Applicant: Microsoft Technology Licensing, LLC, Redmond, WA (US)

(72) Inventors: Zhicong Yao, Seattle, WA (US); Kenneth Charles Boman, Duvall, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 165 days.

(21) Appl. No.: 17/925,447

(22) PCT Filed: May 14, 2021

(86) PCT No.: PCT/US2021/032529
§ 371 (c)(1),
(2) Date: Nov. 15, 2022

(87) PCT Pub. No.: WO2021/231915
PCT Pub. Date: Nov. 18, 2021

(65) Prior Publication Data
US 2023/0185336 A1    Jun. 15, 2023

(30) Foreign Application Priority Data
May 14, 2020    (NL) ..................................... 2025583

(51) Int. Cl.
*G06F 1/16*    (2006.01)
*B29C 65/00*    (2006.01)
(Continued)

(52) U.S. Cl.
CPC ........ *G06F 1/1626* (2013.01); *B29C 66/1242* (2013.01); *B32B 3/02* (2013.01);
(Continued)

(58) Field of Classification Search
CPC ..... B32B 3/02; B32B 17/061; B32B 2457/20; G06F 1/1626; G06F 1/1656
See application file for complete search history.

(56) References Cited

U.S. PATENT DOCUMENTS 6,126,505 A * 10/2000 Narayanan .............. H01J 9/261
445/25
8,557,158 B2    10/2013 Pan et al.
(Continued)

FOREIGN PATENT DOCUMENTS

CN      1744268 A  *  3/2006  ............ H01J 29/864
CN    207586886 U      7/2018
DE   102017205959 A1   10/2018

OTHER PUBLICATIONS

"Search Report Issued in Netherlands Patent Application No. N2025583", Mailed Date: Feb. 17, 2021, 19 Pages.
(Continued)

*Primary Examiner* — Gerard Higgins
(74) *Attorney, Agent, or Firm* — Ray Quinney & Nebeker P.C.; Paul N. Taylor (57) ABSTRACT

An electronic device includes a display with a glass planar portion and a second material position at an outer edge of the glass planar portion. The glass planar portion defines a majority of a display surface of the display, and the second material is molded to the outer edge of the glass planar portion and defines at least part of a border portion. The second material is curved in a direction perpendicular to the display surface. The second material is composed of a first plurality of segments and a second plurality of segments. Each segment of the second plurality of segments is interposed between adjacent segments of the first plurality of segments, and the first plurality of segments interlock with the second plurality of segments.

20 Claims, 7 Drawing Sheets

(51) Int. Cl.
*B32B 3/02* (2006.01)
*B32B 17/06* (2006.01)
*B29K 709/08* (2006.01)

(52) U.S. Cl.
CPC .......... *B32B 17/061* (2013.01); *G06F 1/1656* (2013.01); *B29K 2709/08* (2013.01); *B32B 2457/20* (2013.01)

(56) References Cited

U.S. PATENT DOCUMENTS

| | | |
|---|---|---|
| 10,019,029 B1 | 7/2018 | Yu et al. |
| 2007/0048470 A1 | 3/2007 | Zadesky et al. |
| 2007/0289180 A1* | 12/2007 | Johnson .................. G09F 13/18 40/546 |
| 2009/0218725 A1 | 9/2009 | Thelemann et al. |
| 2012/0175165 A1 | 7/2012 | Merz et al. |
| 2014/0308469 A1 | 10/2014 | Aida et al. |
| 2015/0214600 A1 | 7/2015 | Golko et al. |
| 2017/0120668 A1 | 5/2017 | Park |
| 2020/0073445 A1 | 3/2020 | Kuna et al. |

OTHER PUBLICATIONS

"International Search Report and Written Opinion Issued in PCT Application No. PCT/US21/032529", Mailed Date: Aug. 6, 2021, 19 Pages.

* cited by examiner

SYSTEMS AND METHODS FOR OVERMOLDING ON ELECTRONIC DEVICE SURFACES

BACKGROUND

Background and Relevant Art

As electronic devices become smaller and lighter, more electronic devices are primarily operated in a user's hand. The display cover or other external surfaces of the housing of conventional electronic devices are flat. Abrupt corners of the flat surfaces are to uncomfortable in the user's hand. To produce smaller and lighter electronic devices, the bezel or border around the display is continually reduced to more efficiently use the surface area of the electronic device. Forming a display cover or other housing surface with curved edges of the panel increases cost. Application of a second border material around the display cover or other housing surface to create a smooth, curved border introduces stress to the display cover or other housing surface during manufacturing and over the lifetime of the device, leading to potential damage to the display cover or other housing surface.

BRIEF SUMMARY

In some embodiments, an electronic device includes a display with a glass planar portion and a second material position at an outer edge of the glass planar portion. The glass planar portion defines a majority of a display surface of the display, and the second material is molded to the outer edge of the glass planar portion and defines at least part of a border portion. The second material is curved in a direction perpendicular to the display surface. The second material is composed of a first plurality of segments and a second plurality of segments. Each segment of the second plurality of segments is interposed between adjacent segments of the first plurality of segments, and the first plurality of segments interlock with the second plurality of segments.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-1 is a perspective view of an electronic device, according to at least one embodiment of the present disclosure;

FIG. 1-2 is a side detail view of the electronic device of FIG. 1-1, according to at least one embodiment of the present disclosure;

DETAILED DESCRIPTION

The present disclosure relates generally to systems and methods for providing a body panel for an electronic device with a curved border portion. More particularly, this disclosure relates to a body panel consisting of a first material connected to a border portion consisting of a second material different from the first. The border portion is formed and applied to the first material in segments during assembly to alleviate stress in the first material associated with contraction of the second material related to cooling and/or curing of the second material. The contraction of the second material around the body panel can damage the body panel, itself, and the residual stress associated with the contraction can render the body panel more susceptible to damage during use or transport of the device.

In some embodiments, an electronic device has at least one substantially planar body panel that comprises a portion of a first surface of the device. In some embodiments, the body panel comprises a majority of the first surface of the device. In some embodiments, the electronic device has a complementary second body panel that is substantially planar that comprises a portion of a second surface of the device. In some embodiments, the electronic device has a complementary second body panel that is substantially planar and comprises a majority of the second surface of the device. In some embodiments, the first body panel and the second body panel are parallel to one another. In some embodiments, the first surface is a top surface and the second surface is a bottom surface. In some embodiments, the first surface is a front surface and the second surface is a back surface.

Figure 11:
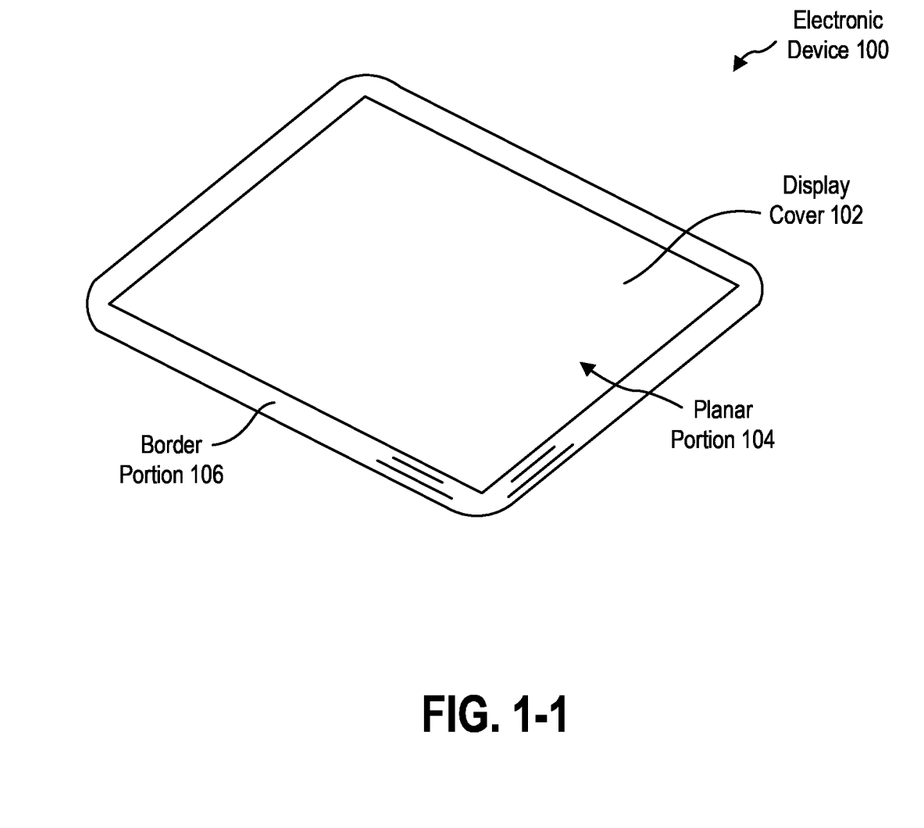
Figure 12:
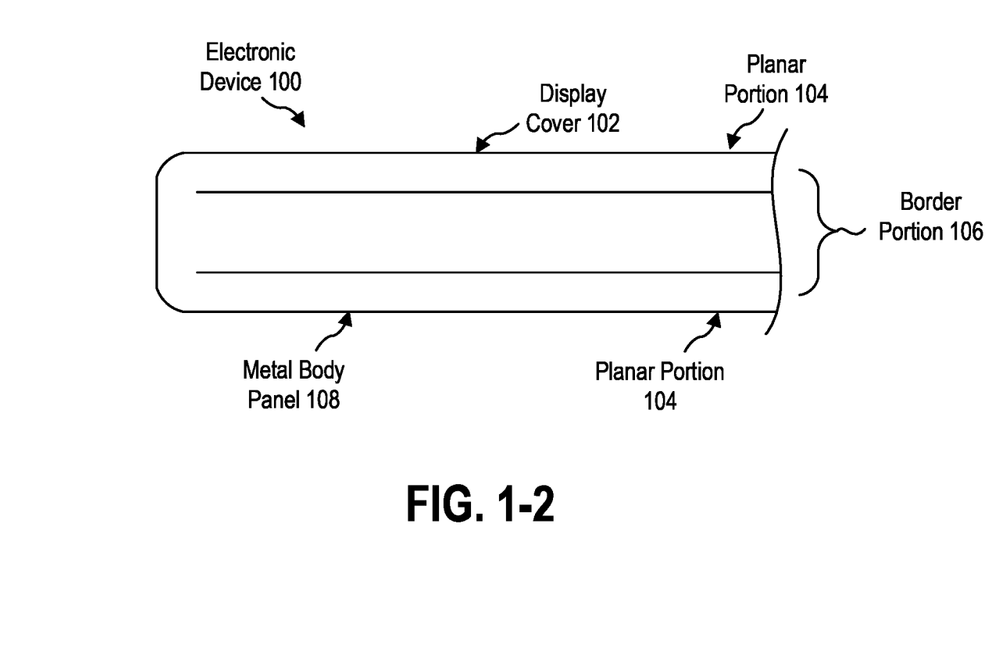

FIGS. 1-1 and 1-2 illustrate an embodiment of an electronic device 100 with a display cover 102 on a first surface and a metal body panel 108 on an opposite second surface. FIG. 1-1 is a perspective view of the display cover 102 defining the planar portion 104 of the electronic device 100 that is bounded by the border portion 106. FIG. 1-2 is a side view of the electronic device 100 of FIG. 1-1 showing border portions 106 positioned at the edges of the planar portions 104, defined by the display cover 102 and a metal body panel 108. The border portions 106 provide a curved and continuous surface to the electronic device 100 from the planar portion 104 of the display cover 102 around the side of the electronic device 100 to the planar portion 104 of the metal body panel 108 on the back of the electronic device 100.

Figure 2:
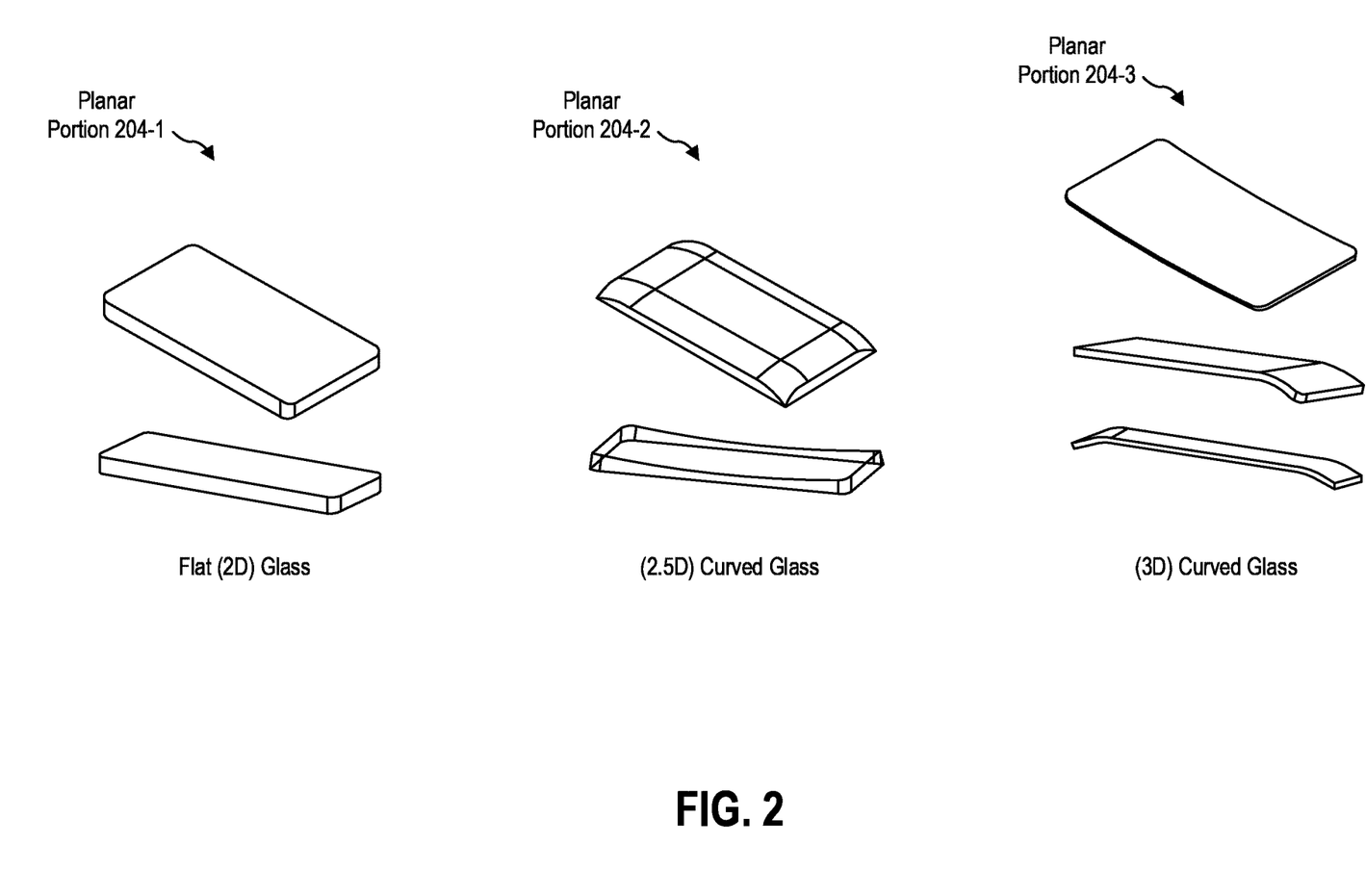
FIG. 2 is a perspective view of 2D glass, 2.5D glass, and 3D glass, according to at least one embodiment of the present disclosure.

The body panel that forms a portion or a majority of the first surface is, in some embodiments, entirely planar. In some embodiments, the body panel is substantially planar in that at least 90% of a surface of the body panel lies in a single plane or within a 10% deviation from the plane. FIG. 2 illustrates examples of planar or substantially planar glass pieces. In some embodiments, the planar portion 204-1 of the electronic device is entirely planar, such as two-dimensional (2D) glass. In some embodiments, the planar portion 204-2, 204-3 of the electronic device has a curved region adjacent the flat surface, such as the 2.5D and 3D glass illustrated in FIG. 2. In some embodiments, the first surface of the electronic device has a non-planar portion that is separate from the display cover or other body panel, such as a keyboard, trackball, touchpad, other physical input mechanism, a textured grip, other raised or recessed portion, or other continuous or discontinuous region that is not coplanar with the planar portion of the first surface.

In a portable electronic device, the device is commonly held in the user's hand. A curved side of the electronic device can be more comfortable for a user to hold. A planar body panel may be substantially cheaper and easier to manufacture than a curved body panel. In some embodiments, a border portion that joins the planar body panel to another part of the electronic device housing (e.g., a side panel, a complementary second body panel, or a bucket that contains electronic components) can reduce costs, simplify assembly, allow additional product design options, or combinations thereof. In some embodiments, a border portion that joins the planar body panel to another part of the electronic device housing can visually blend the border portion with the planar portion and give the planar portion a curved appearance to a user.

A continuous border portion in a conventional electronic device can apply a compressive or shear force to the body panel as the material of the border portion contracts due to cooling or curing of the second material over time. A segmented border portion according to the present disclosure reduces the forces applied to the body panel, allowing larger area and/or thinner body panels to be used. In some embodiments, the border portion is applied to an outer edge of the body panel. In some embodiments, the border portion is overmolded on the body panel. In some embodiments, at least part of the border portion is applied to a planar surface of the body panel. In some embodiments, the border portion is positioned around a complete outer edge (i.e. perimeter) of the body panel. In some embodiments, the border portion is positioned around less than the complete outer edge of the body panel.

In some embodiments, the electronic device is a mobile electronic device, such as a smartphone or personal media device; a portable computer, such as a hybrid computer, a laptop computer, or a tablet computer; a display, such as a computer monitor, a television, or a video conference device; a household appliance; or another electronic device in which aesthetic appearance is a concern, such as automotive infotainment systems.

In some embodiments, the body panel is a display cover over a display of the electronic device. For example, the body panel may be glass, tempered glass, acrylic or other transparent panel material. In embodiments of an electronic device with a display cover, a segmented border portion reduces the forces on the glass or other transparent material to limit and/or prevent fractures or breakage of the display cover. For example, a glass display cover can fracture under a compressive force, or the stress from the compressive force can make the glass display cover more prone to cracking or breaking during transport or use of the electronic device, even if the display cover does not break immediately after manufacturing. In some embodiments, the body panel is a metal, such as aluminum, magnesium, iron, titanium, or alloys including such metals. In embodiments of an electronic device with a metal body panel having a border portion applied thereto, compressive forces from the cooling and/or curing of the material of the border portion can produce cracks, buckles, or other distortions to the metal body panel.

Figure 3:
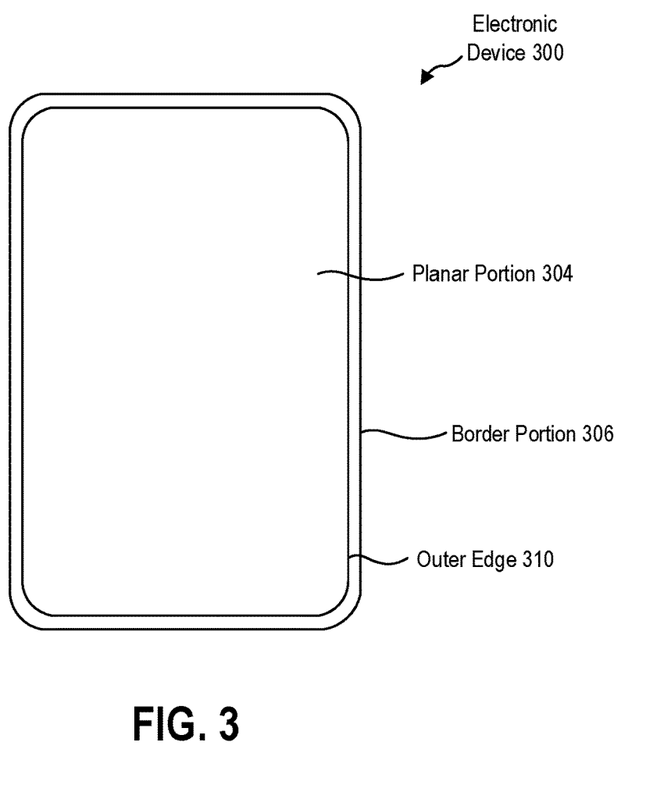
FIG. 3 is a front view of a tablet computer, according to at least one embodiment of the present disclosure.

Some embodiments of electronic devices according to the present disclosure have a body panel with a border portion positioned around a complete outer edge of the body panel. For example, a television may have a border portion that is positioned around the complete outer edge of the display glass. FIG. 3 is a front view of an electronic device 300 with a complete border portion 306. In some embodiments, a tablet has a planar portion 304 that defines a majority of the first surface, and the border portion 306 is positioned around the entire outer edge 310 of the planar portion 304. The display cover of the planar portion experienced greater stress due to manufacturing with a conventional border portion than a border portion according to the present disclosure.

Figure 4:
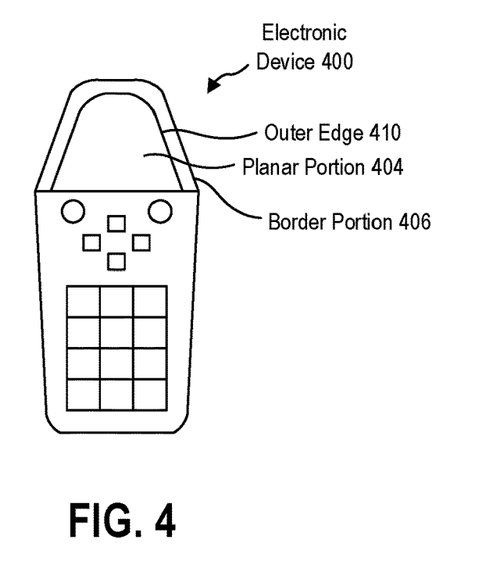
FIG. 4 is a front view of a television remote, according to at least one embodiment of the present disclosure.

In some embodiments, a body panel has a border portion applied to a part of the outer edge. FIG. 4 is a front view of an electronic device 400 with a partial border portion 406. In some embodiments, an electronic device 400, such as a television remote, has a display glass or other planar portion 404 positioned on the upper portion of a top surface of the remote with physical buttons located on a lower portion of the top surface, and the border portion 406 may be applied around three sides of the outer edge 410 of the planar portion 404 with no border portion 406 proximate the lower portion containing buttons.

A border portion includes a second material, in some embodiments, that is different from a first material of the planar body panel. In some embodiments, the second material includes a polymer. In some embodiments, the second material includes a polymer with a glass fill, such as D251 (20% glass fill), D151 (10% glass fill), or D551 (50% glass fill) available from SABIC Plastics. The second material is positioned at the outer edge of the body panel and is composed of a first plurality of segments and a second plurality of segments that are joined to one another at seams therebetween. In some embodiments, each segment of the second plurality of segments is interposed between adjacent segments of the first plurality of segments. In some embodiments, at least one segment of the border portion includes a third material, different from the second material. The third material can provide different or additional material properties from the second material.

Figure 5:
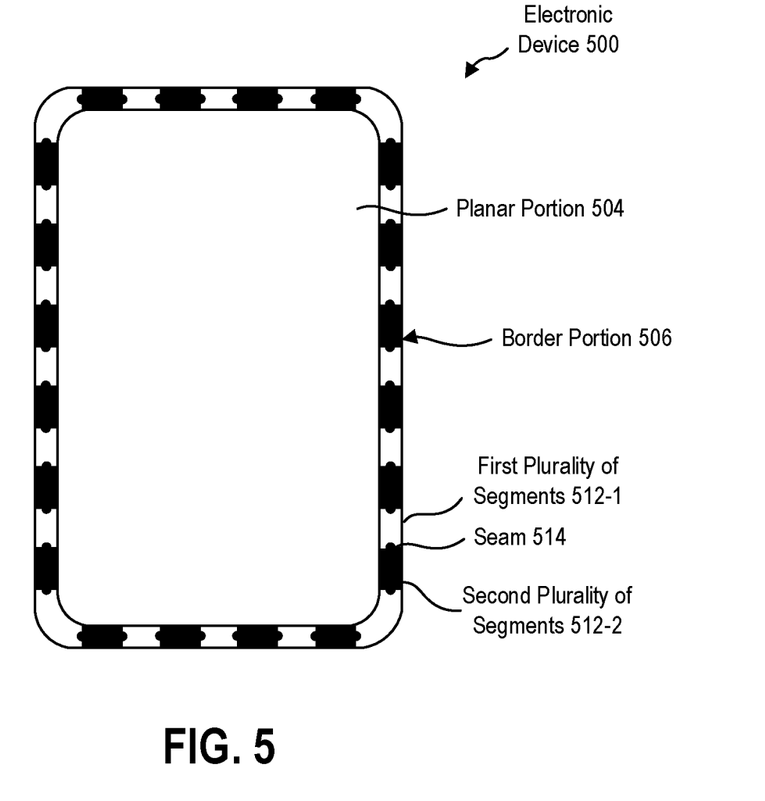
FIG. 5 is a top view of a body panel with a segmented border portion, according to at least one embodiment of the present disclosure.

Referring now to FIG. 5, some embodiments of an electronic device 500 according to the present disclosure have a segmented border portion 506. In some embodiments, a segmented border portion 506 is formed in two stages with a first plurality of segments 512-1 formed first, and a second plurality of segments 512-2 positioned in spaces between the segments of the first plurality of segments 512-1. The first plurality of segments 512-1 and second plurality of segments 512-2 are joined at seams 514 at lateral edges of the segments by adherence and/or mechanical locking of the segments.

In some embodiments, the second material has a higher strength than the third material, and the third material is positioned at the corners of the device to provide shock absorption. In some embodiments, the third material has greater radiotransparency than the second material, and a segment of the third material is positioned adjacent and/or covering a radio frequency (RF) antenna of the electronic device, such that the RF antenna can transmit and receive RF signals through the RF window created by the segment of third material. For example, the second material may be D551 (polycarbonate material with 50% glass fiber) and the third material may be D151 (polycarbonate material with 10% glass fiber by Sabic).

In some embodiments, such as that illustrated in FIG. 5, interlocks between segments can provide additional strength to the seams 514. In some embodiments, the interlocks are mechanical interlocks that inhibit the movement of a first segment relative to a second segment at the seam 514. For example, the interlocks may include complementary structures that mate together to limit and/or prevent relative movement, such as a protrusion and complementary recess, a dovetail and complementary pins, sawtooth patterns, irregular patterns, or other surface textures. In some embodiments, a mechanical interlock can limit and/or prevent relative movement in one direction transverse to the seam 514, such as a dovetail. In some embodiments, a mechanical interlock can limit and/or prevent relative movement in two directions transverse to the seam 514, such as a fully captured post. In some embodiments, the interlocks increase a surface area of the seam 514, providing greater contact surface for the first segment and second segment to bond or adhere to one another.

In some embodiments, different materials in the border portion can provide additional or different functionality while maintaining an appearance of a single seamless border portion. For example, a border portion can include a segment with a softer or more elastic material to allow the inclusion of a physical button in the border portion. In some embodiments, a physical button (e.g., a button that is actuated by depressing the button) is located underneath an outer surface of the border portion, and the physical button is actuatable by elastically deforming the segment contacting the physical button.

In some embodiments, a border portion can include a segment configured to allow the inclusion of haptic feedback in the border portion. In some embodiments, a segment is located contacting a motor or actuator (such as a linear actuator, vibration motor, or piezoelectric motor) that provides haptic feedback, and the segment transmits the haptic information to the user.

In some embodiments, the border portion includes a segment with electrically conductive material to allow touch-sensitive controls embedded in or below the border portion. In some embodiments, a touch-sensitive button (e.g., a capacitive touch surface) is located underneath a segment of the outer surface of the border portion, and the touch-sensitive button is activatable by a user touching, or pressing on, the segment.

Figure 6:
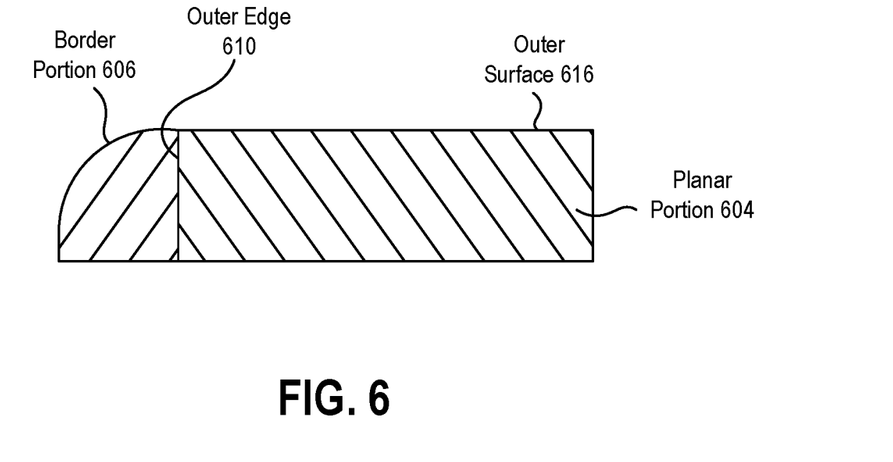
FIG. 6 is a side cross-sectional view of a body panel with a curved border portion, according to at least one embodiment of the present disclosure.

A border portion can have a continuous or discontinuous profile. Referring now to FIG. 6, in some embodiments, an outer surface 616 of at least one segment of the border portion 606 is continuous with the outer surface 616 of the planar portion 604, such that the outer surface 616 of the segment provides the appearance of a continuous surface with the planar portion 604 where the segment contacts the outer edge 610 of the planar portion 604. In some embodiments, an outer surface of at least one segment of the border portion is discontinuous with the outer surface of the planar portion, such that the outer surface of the segment is oriented at a different angle from the planar portion where the segment contacts the outer edge of the planar portion.

In some embodiments, at least one segment of the border portion 606 has a curved edge profile. In some embodiments, the curved profile has a constant radius of curvature, such as illustrated in FIG. 6. In some embodiments, the curved profile has a decreasing radius of curvature away from the planar portion. In some embodiments, the curved profile has an increasing radius of curvature away from the planar portion. In some embodiments, at least one segment of the border portion has a discontinuous profile, such as a beveled or chamfered profile.

Figure 7:
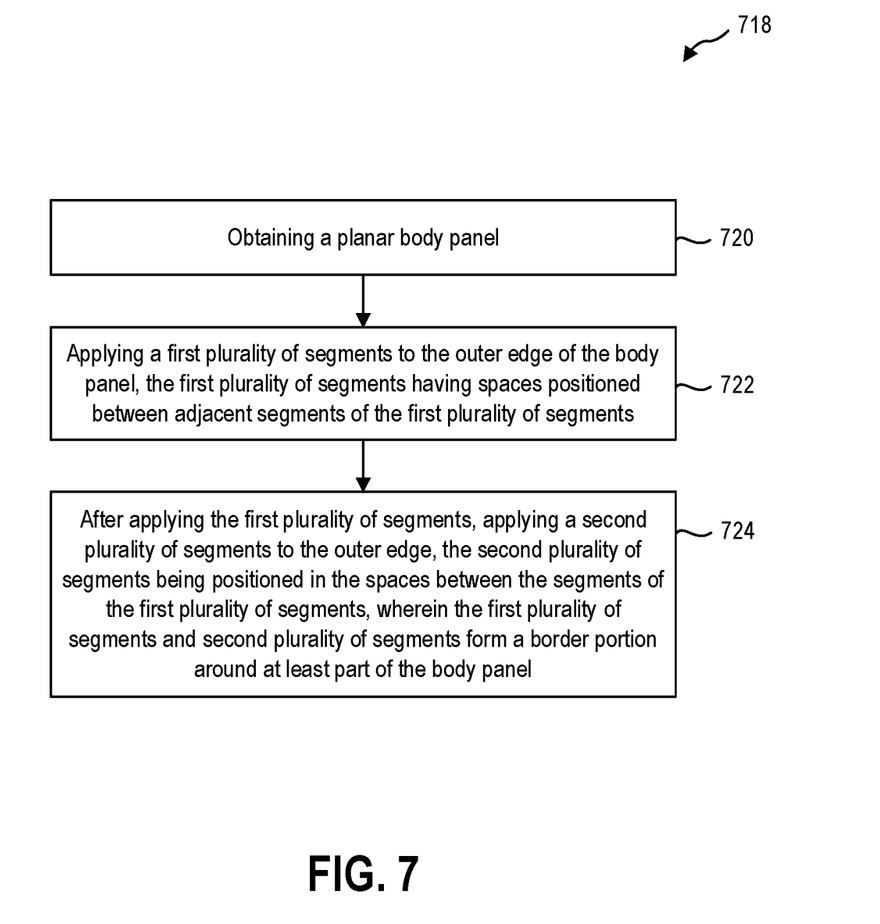
FIG. 7 is a flowchart illustrating a method of manufacturing an electronic device, according to at least one embodiment of the present disclosure.

The segmented border portion is applied to the planar body panel in at least two stages. In some embodiments, a method 718 of manufacturing an electronic device includes obtaining (720) a planar or substantially planar body panel including a first material and applying (722) a first plurality of segments to an outer edge of the body panel. In some embodiments, the first plurality of segments includes a second material different from the first material. For example, the first material may be glass and the second material may be a polymer.

In some embodiments, the second material facilitates injection molding or another application of the second material at an elevated temperature. In some embodiments, a mask is positioned proximate and/or adjacent to the outer edge of the body panel and a first shot of the second material is molded to the outer edge in the area around the mask and abutting the mask, such that when the mask is removed, the lateral edges of the first plurality of segments are defined by the mask shape.

The method further includes applying (724) a second plurality of segments to the outer edge of the body panel. In some embodiments, the second plurality of segments are positioned in the spaces between the segments of the first plurality of segments. In some embodiments, the segments of the second plurality of segments each contact at least one of the segments of the first plurality of segments at the lateral edge of the segments to form seams therebetween. In some embodiments, the second plurality of segments fill the spaces between the segments of the first plurality of segments, and the first plurality of segments and second plurality of segments produce a continuous border portion.

In some embodiments, the border portion is positioned around the entire outer edge of the body panel. In some embodiments, the border portion is positioned on less than the entire outer edge of the body panel. In some embodiments, the border portion is less than 90% of the entire outer edge of the body panel. In some embodiments, the border portion is less than 75% of the entire outer edge of the body panel. In some embodiments, the border portion is less than 50% of the entire outer edge of the body panel.

Figure 8:
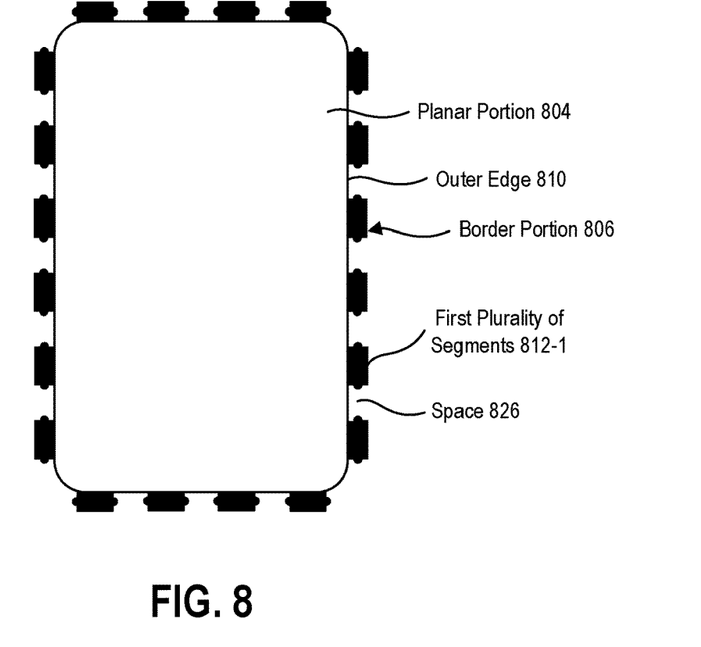
FIG. 8 is a front view of a body panel with a first plurality of segments of a border portion, according to at least one embodiment of the present disclosure.
Figure 9:
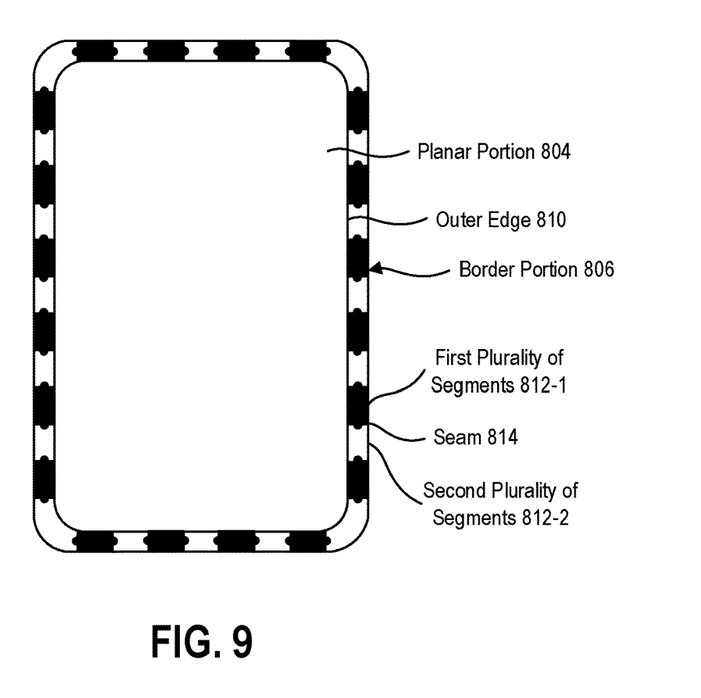
FIG. 9 is a front view of the body panel of FIG. 8 with a second plurality of segments of the border portion, according to at least one embodiment of the present disclosure.

FIGS. 8 and 9 illustrate the two stages of the application process of the method 718 described in relation to FIG. 7. FIG. 8 illustrates a body panel comprising a planar portion 804 and border portion with only a first plurality of segments 812-1. The first plurality of segments 812-1 is applied to the outer edge 810 of the planar portion 804. The segments of the first plurality of segments 812-1 are formed by masking off the regions between the segments, and upon removal of the mask, the first plurality of segments 812-1 is left with spaces 826 therebetween.

FIG. 9 shows the body panel of FIG. 8 with the complete border portion 806 around the outer edge 810 of the planar portion 804. In some embodiments, the first plurality of segments 812-1 and second plurality of segments 812-2 are positioned on equal lengths of the outer edge 810 of the planar portion 804. In some embodiments, the first plurality of segments 812-1 and second plurality of segments 812-2 are positioned on different lengths of the outer edge 810 of the planar portion 804. In some embodiments, the first plurality of segments 812-1 is positioned on less than 90% of the outer edge 810 of the planar portion 804. In some embodiments, the first plurality of segments 812-1 is positioned on less than 75% of the outer edge 810 of the planar portion 804. In some embodiments, the first plurality of segments 812-1 is positioned on less than 50% of the outer edge 810 of the planar portion 804.

In some embodiments, the first plurality of segments and second plurality of segments are positioned on equal lengths of the border portion when the border portion is positioned on less than the entire outer edge of the body panel. In some embodiments, the first plurality of segments and second plurality of segments are positioned on different lengths of the border portion when the border portion is positioned on less than the entire outer edge of the body panel. In some embodiments, the first plurality of segments is positioned on less than 90% of the border portion. In some embodiments, the first plurality of segments is positioned on less than 75% of the border portion. In some embodiments, the first plurality of segments is positioned on less than 50% of the border portion. In some embodiments, the second plurality of segments fills the spaces between the first plurality of segments. For example, the second plurality of segments is positioned along 10% of the border portion when the first plurality of segments is positioned along 90%.

In some embodiments, the first plurality of segments contract due to cooling from an elevated application temperature to an ambient temperature and/or due to curing of the second material over time. Therefore, the compression force to the body panel related to the contraction of the second material can be reduced by allowing the first plurality of segments to cool and contract prior to application of the second plurality of segments. The compression force can be reduced proportionally to the ratio of a length of the first plurality of segments (which are contracted) prior to the application of the second plurality of segments. In some embodiments, a 1:1 ratio of border portion length of the first plurality of segments to the second plurality of segments reduces the compressive force on the body panel by approximately 50%.

In some embodiments, the method further includes allowing the first plurality of segments to cool from a first temperature to a second temperature before applying the second plurality of segments. In some embodiments, the first temperature is the injection temperature of the second material when injection molded around the mask, and the second temperature is below 130° C. In some embodiments, the first temperature is the injection temperature of the second material when injection molded around the mask, and the second temperature is below 90° C.

In some embodiments, the adherence of segments and/or mechanical locking of the border portion 806 to the outer edge 810 of the planar portion 804 can be improved by priming or etching of the outer edge 810 prior to application of the second material. In some embodiments, the method includes altering the outer edge 810 to increase surface area. In some embodiments, the outer edge 810 is chemically etched to increase the surface relief and, therefore, the surface area of the outer edge 810. In some embodiments, the outer edge 810 is mechanically etched to increase the surface relief and, therefore, the surface area of the outer edge 810. In some embodiments, the outer edge 810 is laser etched to increase the surface relief and, therefore, the surface area of the outer edge 810. In some embodiments, the outer edge 810 is ion-etched or plasma treated to increase the surface relief and, therefore, the surface area of the outer edge 810.

In some embodiments, the adherence or interlock between segments of the first plurality of segments 812-1 and segments of the second plurality of segments 812-2 can be improved by preparation of the lateral surfaces at the seams 814. In some embodiments, the lateral surface is primed in a similar manner to the outer edge. In some embodiments, the lateral surface(s) is primed in a different manner. In some embodiments, the lateral surface(s) is chemically etched to increase the surface relief and, therefore, the surface area of the lateral surface(s). In some embodiments, the lateral surface(s) is mechanically etched to increase the surface relief and, therefore, the surface area of the lateral surface(s). In some embodiments, the lateral surface(s) is laser etched to increase the surface relief and, therefore, the surface area of the lateral surface(s). In some embodiments, the lateral surface(s) is ion-etched to increase the surface relief and, therefore, the surface area of the lateral surface(s).

In some embodiments where the second plurality of segments does not entirely fill the spaces between the segments of the first plurality of segments, the method further includes applying at least one additional segment. In some embodiments, the at least one additional segment is a third plurality of segments. In some embodiments, the at least one additional segment is a single segment of a third material different from the second material, such as a radiotransparent material to create an RF window in the border portion. In some embodiments, the at least one additional segment includes corner segments and a third material with greater elasticity than the second material to provide shock absorption at the corners of the electronic device.

INDUSTRIAL APPLICABILITY

The present disclosure relates generally to systems and methods for providing a body panel for an electronic device with a curved border portion. More particularly, this disclosure relates to a body panel consisting of a first material connected to a border portion consisting of a second material different from the first. The border portion is formed and applied to the first material in segments during assembly to alleviate stress in the first material and second material associated with contraction of the second material related to cooling and/or curing of the second material.

In some embodiments, an electronic device has at least one substantially planar body panel that comprises a portion of a first surface of the device. In some embodiments, the body panel comprises a majority of the first surface of the device. In some embodiments, the electronic device has a complementary second body panel that is substantially planar that comprises a portion of a second surface of the device. In some embodiments, the electronic device has a complementary second body panel that is substantially planar and comprises a majority of the second surface of the device. In some embodiments, the first body panel and the second body panel are parallel to one another. In some embodiments, the first surface is a top surface and the second surface is a bottom surface. In some embodiments, the first surface is a front surface and the second surface is a back surface.

The body panel that forms a portion or a majority of the first surface is, in some embodiments, entirely planar. In some embodiments, the body panel is substantially planar in that at least 90% of a surface of the body panel lies in a single plane or within a 10% deviation from the plane. In some embodiments, the first surface of the electronic device is entirely planar. In some embodiments, the first surface of the electronic device has a non-planar portion, such as a keyboard, trackball, touchpad, other physical input mechanism, a textured grip, other raised or recessed portion, or other continuous or discontinuous region that is not coplanar with the planar portion of the first surface.

In a portable electronic device, the device is commonly held in the user's hand. A curved side of the electronic device can be more comfortable for a user to hold. A planar body panel may be substantially cheaper and easier to manufacture than a curved body panel. In some embodiments, a border portion that joins the planar body panel to another part of the electronic device housing (e.g., a side panel, a complementary second body panel, or a bucket that contains electronic components) can reduce costs, simplify assembly, allow additional product design options, or combinations thereof. In some embodiments, a border portion that joins the planar body panel to another part of the electronic device housing can visually blend the border portion with the planar portion and give the planar portion a curved appearance to a user.

A continuous border portion in a conventional electronic device can apply a compressive or shear force to the body panel as the material of the border portion contracts due to cooling or curing of the second material over time. A segmented border portion according to the present disclosure reduces the forces applied to the body panel, allowing larger area and/or thinner body panels to be used. In some embodiments, the border portion is applied to an outer edge of the body panel. In some embodiments, the border portion is overmolded on the body panel. In some embodiments, at least part of the border portion is applied to a planar surface of the body panel. In some embodiments, the border portion is positioned around a complete outer edge (i.e. perimeter) of the body panel. In some embodiments, the border portion is positioned around less than the complete outer edge of the body panel.

In some embodiments, the electronic device is a mobile electronic device, such as a smartphone or personal media device; a portable computer, such as a hybrid computer, a laptop computer, or a tablet computer; a display, such as a computer monitor, a television, or a video conference device; a household appliance; or another electronic device in which aesthetic appearance is a concern, such as automotive infotainment systems.

In some embodiments, the body panel is a display cover over a display of the electronic device. For example, the body panel may be glass, tempered glass, acrylic or other transparent panel material. In embodiments of an electronic device with a display cover, a segmented border portion reduces the forces on the glass or other transparent material to limit and/or prevent fractures or breakage of the display cover. For example, a glass display cover can fracture under a compressive force, or the stress from the compressive force can make the glass display cover more prone to cracking or breaking during transport or use of the electronic device, even if the display cover does not break immediately after manufacturing. In some embodiments, the body panel is a metal, such as aluminum, magnesium, iron, titanium, or alloys including such metals. In embodiments of an electronic device with a metal body panel having a border portion applied thereto, compressive forces from the cooling and/or curing of the material of the border portion can produce cracks, buckles, or other distortions to the metal body panel when the body panel is thin, such as less than 1.0 mm thick, less than 0.8 mm thick, or less than 0.6 mm thick.

Some embodiments of electronic devices according to the present disclosure have a body panel with a border portion positioned around a complete outer edge of the body panel. For example, a television may have a border portion that is positioned around the complete outer edge of the display glass. In some embodiments, a body panel has a border portion applied to a part of the outer edge. For example, a television remote may have a display glass positioned on the upper portion of a top surface of the remote with physical buttons located on a lower portion of the top surface, and the border portion may be applied around three sides of the display glass with no border portion proximate the lower portion containing buttons.

A border portion includes a second material, in some embodiments, that is different from a first material of the planar body panel. In some embodiments, the second material includes a polymer. In some embodiments, the second material includes a polymer with a glass fill, such as D251 (20% glass fill), D151 (10% glass fill), or D551 (50% glass fill) available from SABIC Plastics. The second material is positioned at the outer edge of the body panel and is composed of a first plurality of segments and a second plurality of segments that are joined to one another at seams therebetween. In some embodiments, each segment of the second plurality of segments is interposed between adjacent segments of the first plurality of segments. In some embodiments, at least one segment of the border portion includes a third material, different from the second material. The third material can provide different or additional material properties from the second material.

In some embodiments, the second material has a higher strength than the third material, and the third material is positioned at the corners of the device to provide shock absorption. In some embodiments, the third material has greater radiotransparency than the second material, and a segment of the third material is positioned adjacent and/or covering an RF antenna of the electronic device, such that an RF antenna can transmit and receive RF signals through the RF window created by the segment of third material. For example, the second material may be D551 and the third material may be D151.

Interlocks between segments can provide additional strength to the seams between the segments. In some embodiments, the interlocks are mechanical interlocks that inhibit the movement of a first segment relative to a second segment at the seam. For example, the interlocks may include complementary structures that mate together to limit and/or prevent relative movement, such as a protrusion and complementary recess, a dovetail and complementary pins, sawtooth patterns, irregular patterns, or other surface textures. In some embodiments, a mechanical interlock can limit and/or prevent relative movement in one direction transverse to the seam, such as a dovetail. In some embodiments, a mechanical interlock can limit and/or prevent relative movement in two directions transverse to the seam, such as a fully captured post. In some embodiments, the interlocks increase a surface area of the seam, providing greater contact surface for the first segment and second segment to bond or adhere to one another.

In some embodiments, different materials in the border portion can provide additional or different functionality while maintaining an appearance of a single seamless border portion. For example, a border portion can include a segment with a softer or more elastic material to allow the inclusion of a physical button in the border portion. In some embodiments, a physical button (e.g., a button that is actuated by depressing the button) is located underneath an outer surface of the border portion, and the physical button is actuatable by elastically deforming the segment contacting the physical button.

In some embodiments, a border portion can include a segment with a softer or more elastic material to allow the inclusion of haptic feedback in the border portion. In some embodiments, a segment is located contacting a motor or actuator (such as a linear actuator, vibration motor, or piezoelectric motor) that provides haptic feedback, and the segment transmits the haptic information to the user.

In some embodiments, the border portion includes a segment with electrically conductive material to allow touch-sensitive controls embedded in or below the border portion. In some embodiments, a touch-sensitive button (e.g., a capacitive touch surface) is located underneath an outer surface of the border portion, and the physical button is actuatable by touching the segment contacting the physical button.

A border portion can have a continuous or discontinuous profile. In some embodiments, an outer surface of at least one segment of the border portion is continuous with the outer surface of the planar portion, such that the outer surface of the segment provides the appearance of a continuous surface with the planar portion where the segment contacts the outer edge of the planar portion. In some embodiments, an outer surface of at least one segment of the border portion is discontinuous with the outer surface of the planar portion, such that the outer surface of the segment is oriented at a different angle from the planar portion where the segment contacts the outer edge of the planar portion.

In some embodiments, at least one segment of the border portion has a curved edge profile. In some embodiments, the curved profile has a constant radius of curvature. In some embodiments, the curved profile has a decreasing radius of curvature away from the planar portion. In some embodiments, the curved profile has an increasing radius of curvature away from the planar portion. In some embodiments, at least one segment of the border portion has a discontinuous profile, such as a beveled or chamfered profile.

The segmented border portion is applied to the planar body panel in at least two stages. In some embodiments, a method of manufacturing an electronic device includes obtaining a planar or substantially planar body panel including a first material and applying a first plurality of segments to an outer edge of the body panel. In some embodiments, the first plurality of segments includes a second material different from the first material. For example, the first material may be glass and the second material may be a polymer.

In some embodiments, the second material facilitates injection molding or another application of the second material at an elevated temperature. In some embodiments, a mask is positioned proximate and/or adjacent to the outer edge of the body panel and a first shot of the second material is molded to the outer edge in the area around the mask and abutting the mask, such that when the mask is removed, the lateral edges of the first plurality of segments are defined by the mask shape.

The method further includes applying a second plurality of segments to the outer edge of the body panel. In some embodiments, the second plurality of segments are positioned in the spaces between the segments of the first plurality of segments. In some embodiments, the segments of the second plurality of segments each contact at least one of the segments of the first plurality of segments at the lateral edge of the segments to form seams therebetween. In some embodiments, the second plurality of segments fill the spaces between the segments of the first plurality of segments, and the first plurality of segments and second plurality of segments produce a continuous border portion.

In some embodiments, the border portion is positioned around the entire outer edge of the body panel. In some embodiments, the border portion is positioned on less than the entire outer edge of the body panel. In some embodiments, the border portion is less than 90% of the entire outer edge of the body panel. In some embodiments, the border portion is less than 75% of the entire outer edge of the body panel. In some embodiments, the border portion is less than 50% of the entire outer edge of the body panel.

In some embodiments, the first plurality of segments and second plurality of segments are positioned on equal lengths of the outer edge of the body panel. In some embodiments, the first plurality of segments and second plurality of segments are positioned on different lengths of the outer edge of the body panel. In some embodiments, the first plurality of segments is positioned on less than 90% of the outer edge of the body panel. In some embodiments, the first plurality of segments is positioned on less than 75% of the outer edge of the body panel. In some embodiments, the first plurality of segments is positioned on less than 50% of the outer edge of the body panel.

In some embodiments, the first plurality of segments and second plurality of segments are positioned on equal lengths of the border portion when the border portion is positioned on less than the entire outer edge of the body panel. In some embodiments, the first plurality of segments and second plurality of segments are positioned on different lengths of the border portion when the border portion is positioned on less than the entire outer edge of the body panel. In some embodiments, the first plurality of segments is positioned on less than 90% of the border portion. In some embodiments, the first plurality of segments is positioned on less than 75% of the border portion. In some embodiments, the first plurality of segments is positioned on less than 50% of the border portion. In some embodiments, the second plurality of segments fills the spaces between the first plurality of segments. For example, the second plurality of segments is positioned along 10% of the border portion when the first plurality of segments is positioned along 90%.

In some embodiments, the first plurality of segments contract due to cooling from an elevated application temperature to an ambient temperature and/or due to curing of the second material over time. Therefore, the compression force to the body panel related to the contraction of the second material can be reduced by allowing the first plurality of segments to cool and contract prior to application of the second plurality of segments. The compression force can be reduced proportionally to the ratio of a length of the first plurality of segments (which are contracted) prior to the application of the second plurality of segments. In some embodiments, a 1:1 ratio of border portion length of the first plurality of segments to the second plurality of segments reduces the compressive force on the body panel by approximately 50%.

In some embodiments, the method further includes allowing the first plurality of segments to cool from a first temperature to a second temperature before applying the second plurality of segments. In some embodiments, the first temperature is the injection temperature of the second material when injection molded around the mask, and the second temperature is below 130° C. In some embodiments, the first temperature is the injection temperature of the second material when injection molded around the mask, and the second temperature is below 90° C.

In some embodiments, the adherence of segments and/or mechanical locking of the border portion to the outer edge of the body panel can be improved by priming or etching of the outer edge prior to application of the second material. In some embodiments, the method includes altering the outer edge to increase surface area. In some embodiments, the outer edge is chemically etched to increase the surface relief and, therefore, the surface area of the outer edge. In some embodiments, the outer edge is mechanically etched to increase the surface relief and, therefore, the surface area of the outer edge. In some embodiments, the outer edge is laser etched to increase the surface relief and, therefore, the surface area of the outer edge. In some embodiments, the outer edge is ion-etched or plasma-treated to increase the surface relief and, therefore, the surface area of the outer edge.

In some embodiments, the adherence or interlock between segments of the first plurality of segments and segments of the second plurality of segments can be improved by preparation of the lateral surfaces at the seams. In some embodiments, the lateral surface is primed in a similar manner to the outer edge. In some embodiments, the lateral surface(s) is primed in a different manner. In some embodiments, the lateral surface(s) is chemically etched to increase the surface relief and, therefore, the surface area of the lateral surface(s). In some embodiments, the lateral surface(s) is mechanically etched to increase the surface relief and, therefore, the surface area of the lateral surface(s). In some embodiments, the lateral surface(s) is laser etched to increase the surface relief and, therefore, the surface area of the lateral surface(s). In some embodiments, the lateral surface(s) is ion-etched to increase the surface relief and, therefore, the surface area of the lateral surface(s).

In some embodiments where the second plurality of segments does not entirely fill the spaces between the segments of the first plurality of segments, the method further includes applying at least one additional segment. In some embodiments, the at least one additional segment is a third plurality of segments. In some embodiments, the at least one additional segment is a single segment of a third material different from the second material, such as a radiotransparent material to create an RF window in the border portion. In some embodiments, the at least one additional segment includes corner segments and a third material with greater elasticity that the second material to provide shock absorption at the corners of the electronic device.

The present disclosure describes electronic devices and methods of manufacturing electronic devices with improved aesthetics and comfort while enabling the use of larger body panels with increased durability and/or portability. The present disclosure relates to systems and methods for providing a body panel for an electronic device with a segmented border portion according to at least the examples provided in the sections below:

1. An electronic device (e.g., 100) comprising:
    a display cover (e.g., 102) including a glass planar portion (e.g., 104) including a first material, and a second material positioned at an outer edge (e.g., 310) of the glass planar portion, wherein:
        the glass planar portion defines a majority of a display surface, and
        the second material is molded to the outer edge of the glass planar portion and defines at least part of a border portion (e.g., 606) that is curved in a direction perpendicular to the display surface (e.g., outer surface 616), wherein the second material is composed of a first plurality of segments (e.g., 512-1) and a second plurality of segments (e.g., 512-2), and wherein each segment of the second plurality of segments is interposed between adjacent segments of the first plurality of segments, and wherein the first plurality of segments interlock (e.g., seam 514) with the second plurality of segments.
2. The electronic device of section 1, wherein a material composition of the first plurality of segments is different than a material composition of the second plurality of segments.
3. The electronic device of section 1 or 2, wherein each segment of the first plurality of segments and the second plurality of segments includes one or more interlocking features to facilitate the first plurality of segments interlocking with the second plurality of segments.
4. The electronic device of any preceding section, wherein the display is a touch-sensitive display.
5. The electronic device of section 4, wherein a touch-sensitive region of the touch-sensitive display includes at least part of the border portion.
6. The electronic device of any preceding section, wherein at least one segment of the second material is coupled to electronic circuitry of the electronic device and configured to provide physical button functionality.
7. The electronic device of any preceding section, further comprising a radio frequency antenna, wherein at least one segment of the second material is radiotransparent and wherein the antenna is located proximate the radiotransparent segment.
8. The electronic device of any preceding section, further comprising a housing (e.g., metal body panel 108), wherein the second material connects the glass planar portion to the housing.
9. A method of manufacturing the display of section 1, the method comprising:
    obtaining (720) the glass planar portion;
    applying (722) the first plurality of segments to the outer edge of the glass planar portion, the first plurality of segments having spaces positioned between adjacent segments of the first plurality of segments; and
    after applying the first plurality of segments, applying (724) the second plurality of segments to the outer edge, the second plurality of segments being positioned in the spaces between the segments of the first plurality of segments, wherein the first plurality of segments and second plurality of segments form the border portion of the display.

10. The method of section 9, wherein applying the first plurality of segments includes
    applying the first plurality of segments at a first temperature; and
    the method further comprises, before applying the second plurality of segments, allowing the first plurality of segments to cool to a second temperature, wherein the first plurality of segments contracts when cooling to the second temperature, and wherein the segments of the second plurality of segments are sized to interlock with the first plurality of segments after the contraction.
11. The method of section 9 or 10, further comprising altering the outer edge of the glass pane before applying the first plurality of segments.
12. The method of any of sections 9-11, further comprising altering a lateral edge of the first plurality of segments before applying the second plurality of segments.
13. An electronic device body panel comprising:
    a planar portion (e.g., 804) including a first material, wherein the planar portion has an outer edge (e.g., 810),
    a border portion (e.g., 806) connected to the planar portion along at least part of the outer edge of the planar portion, the border portion composed of a second material different from the first material, wherein the border portion includes:
        a first plurality of segments (e.g., 812-1) directly connected to the outer edge, and
        a second plurality of segments (e.g., 812-2) directly connected to the outer edge, wherein each segment of the second plurality of segments is interposed between segments of the first plurality of segments, and wherein each segment of the second plurality of segments meets an adjacent segment of the first plurality of segments at a corresponding seam (e.g., 814).
14. The body panel of section 13, wherein the first material is glass.
15. The body panel of section 13 or 14, wherein the second material is a polymer.
16. The body panel of any of sections 13-15, wherein each seam includes an interlock between the corresponding segments.
17. The body panel of any of sections 13-16, wherein the second plurality of segments is radiotransparent.
18. The body panel of any of sections 13-17, wherein the seam is waterproof.
19. The body panel of any of sections 13-18, wherein the border portion is curved in a direction normal to a surface plane of the planar portion.
20. The body panel of any of sections 13-19, wherein the planar portion has a curved region proximate at least a portion of the outer edge.
21. The body panel of any of sections 13-20, wherein the border portion is asymmetrical.
22. The body panel of any of sections 13-21, wherein the border portion is positioned around all of the outer edge.
23. The body panel of any of sections 13-22, wherein the first material is metal.
24. The body panel of section 23, wherein the metal is less than 0.6 millimeters thick.
25. The body panel of any of sections 13-24, wherein the border portion is electrically conductive.
26. The body panel of any of sections 13-25, wherein the border portion is configured to visually blend with the planar portion and give the planar portion a curved appearance.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An electronic device comprising:
    a display including a glass planar portion including a first material, and a border portion comprised of at least two moldable materials positioned at an outer edge of the glass planar portion, wherein:
the glass planar portion defines a majority of a display surface, and
the border portion has been molded to the outer edge of the glass planar portion and at least part of the border portion being curved in a direction perpendicular to the display surface,
wherein the border portion is composed of a first plurality of segments each of a second material different from the first material and a second plurality of segments each of a third material different from the first and second materials, and wherein each segment of the second plurality of segments is interposed between adjacent segments of the first plurality of segments, and wherein the first plurality of segments interlock with the second plurality of segments.

2. The electronic device of claim 1, wherein each segment of the first plurality of segments and the second plurality of segments includes one or more interlocking features to facilitate the first plurality of segments interlocking with the second plurality of segments.

3. The electronic device of claim 1, wherein the display is a touch-sensitive display.

4. The electronic device of claim 3, wherein a touch-sensitive region of the touch-sensitive display includes at least part of the border portion.

5. The electronic device of claim 1, wherein a physical button is located in the border portion or: wherein at least one segment of the first plurality of segments of the second material is coupled to electronic circuitry of the electronic device and configured to provide physical button functionality.

6. The electronic device of claim 1, further comprising a radio frequency (RF) antenna, wherein at least one segment of the first plurality of segments of the second material is a radiotransparent segment and wherein the RF antenna is located proximate the radiotransparent segment.

7. The electronic device of claim 1, further comprising a housing, wherein the border portion connects the glass planar portion to the housing.

8. The electronic device of claim 2, wherein the display is a touch-sensitive display.

9. A method of manufacturing the electronic device of claim 1, the method comprising:
obtaining the glass planar portion;
molding the first plurality of segments to the outer edge of the glass planar portion; and
after molding the first plurality of segments, molding the second plurality of segments to the outer edge.

10. The method of claim 9, wherein molding the first plurality of segments includes molding the first plurality of segments at a first temperature, and the method further comprises, before molding the second plurality of segments, allowing the first plurality of segments to cool to a second temperature, wherein the first plurality of segments contracts when cooling to the second temperature, and wherein the segments of the second plurality of segments are sized to interlock with the first plurality of segments after the contraction.

11. The method of claim 9, further comprising priming the outer edge of the glass planar portion before molding the first plurality of segments.

12. The method of claim 9, further comprising preparing a lateral edge of the first plurality of segments before molding the second plurality of segments, wherein the lateral edges of the first plurality of segments are the edges that are for directly connecting with corresponding edges on the second plurality of segments.

13. An electronic device body panel comprising:
a planar body panel portion including a first material, wherein the planar body panel portion has an outer edge, and
a segmented border portion including a second material different from the first material and molded to the planar body panel portion along at least part of the outer edge of the planar body panel portion, wherein the segmented border portion includes:
a first plurality of segments directly connected to the outer edge, and
a second plurality of segments directly connected to the outer edge,
wherein:
each segment of the second plurality of segments is interposed between segments of said first plurality of segments connected to the outer edge;
each segment of the second plurality of segments meets an adjacent segment of the first plurality of segments at a corresponding seam; and
at least one segment of the segmented border portion has a different composition than the other segments of the segmented border portion.

14. The body panel of claim 13 wherein the first plurality of segments interlock with the second plurality of segments.

15. The body panel of claim 13, wherein the first material is glass.

16. The body panel of claim 13, wherein the second material is a polymer.

17. The body panel of claim 13, wherein the border portion and the planar body panel portion are connected at the outer edge to form a continuous surface.

18. The body panel of claim 13, wherein each seam includes a mechanical interlock between the corresponding segments.

19. The body panel of claim 13, wherein the second plurality of segments is radiotransparent.

20. The body panel of claim 13, wherein the seam is waterproof.

* * * * *